United States Patent
Lee (10) Patent No.: US 8,544,920 B2
(45) Date of Patent: Oct. 1, 2013

(54) ROBOT ARM FOR DELIVERING A WAFER AND WAFER-OPERATING MACHINE

(75) Inventor: Yu-Sheng Lee, Taichung County (TW)

(73) Assignee: Rexchip Electronics Corporation, Houli Township, Taichung County (TW)

( * ) Notice: Subject to any disclaimer, the term of this patent is extended or adjusted under 35 U.S.C. 154(b) by 365 days.

(21) Appl. No.: 12/949,117

(22) Filed: Nov. 18, 2010

(65) Prior Publication Data

US 2011/0274522 A1 Nov. 10, 2011

(30) Foreign Application Priority Data

May 4, 2010 (TW) ................................ 99208198 U (51) Int. Cl.
*B66F 19/00* (2006.01)

(52) U.S. Cl.
USPC .......................................................... 294/213

(58) Field of Classification Search
USPC ................... 294/213, 902; 414/941; 901/40
See application file for complete search history.

(56) References Cited

U.S. PATENT DOCUMENTS

| 5,445,486 | A * | 8/1995 | Kitayama et al. | ........ 414/416.03 |
| 6,283,701 | B1 * | 9/2001 | Sundar et al. | ............... 414/744.5 |
| 2004/0113444 | A1 * | 6/2004 | Blonigan et al. | ............... 294/1.1 |
| 2005/0001438 | A1 * | 1/2005 | Lee et al. | ........................ 294/1.1 |
| 2007/0128008 | A1 * | 6/2007 | Morikawa | ..................... 414/217 |

* cited by examiner

*Primary Examiner* — Stephen Vu (74) *Attorney, Agent, or Firm* — Muncy, Geissler, Olds & Lowe, PLLC (57) ABSTRACT

A robot arm for delivering a wafer is disclosed which comprises a carrier plate, an inner ring, a driving device and at least a contact pad. The inner ring is disposed on the carrier plate and defines at least a through-hole. The driving device is connected to the carrier plate to move the carrier plate. The contact pad is disposed at the through-hole of the inner ring and comprises a first protrusion portion and a second protrusion portion. The first protrusion portion protrudes from a first surface of the inner ring and is used for being in contact with the wafer to prevent it from being in contact with the first surface. The second protrusion portion is lodged in the through-hole to fix the contact pad at the inner ring.

17 Claims, 6 Drawing Sheets

ROBOT ARM FOR DELIVERING A WAFER AND WAFER-OPERATING MACHINE

BACKGROUND OF THE INVENTION (a) Field of the Invention

The invention relates to a robot arm for delivering a wafer, a wafer-operating machine and a member thereof, particularly to a robot arm for delivering a wafer, a wafer-operating machine and a member thereof which produce a less amount of ducts and decrease wear and tear on these devices.

(b) Description of the Related Art

In general, robot arms of a semiconductor manufacturing machine approximately include three types: vacuum, clamp and backside contact. Robot arms of the vacuum type and the clamp type are unable to change the direction of a wafer, and robot arms of the backside contact type tend to easily produce particles due to clamp operation. A wafer sorter is used to sort and deliver wafers in the process of manufacturing a semiconductor. Since the wafers may need to be changed their direction during the sorting and delivering operation, the robot arm of the backside contact type is used in the wafer sorter.

Figure 1:
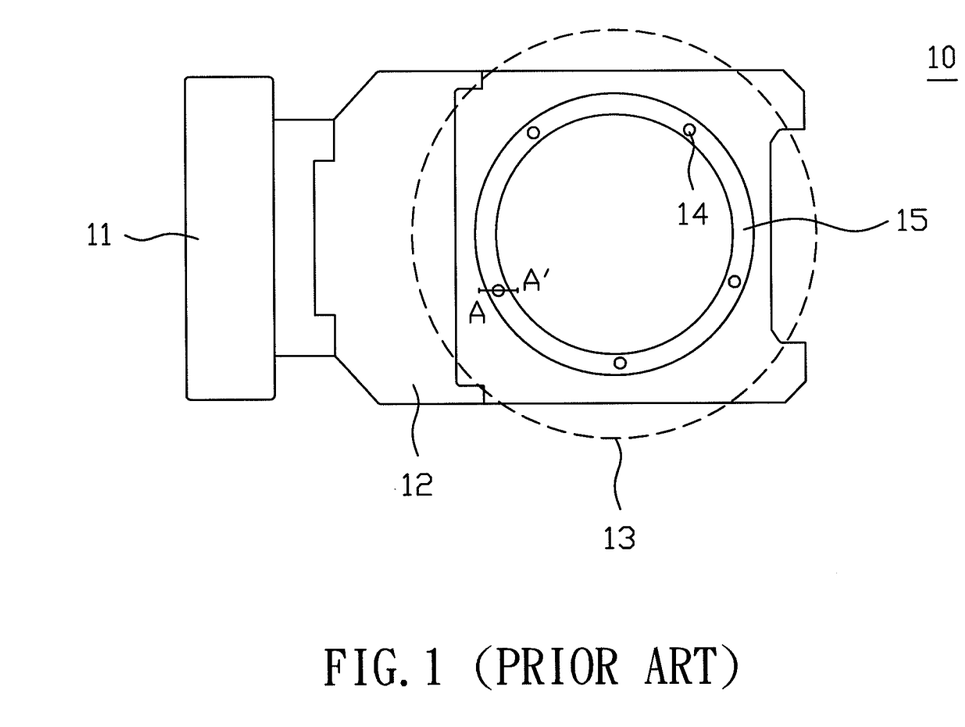
FIG. 1 shows a top view of a conventional robot arm for delivering a wafer.
Figure 2:
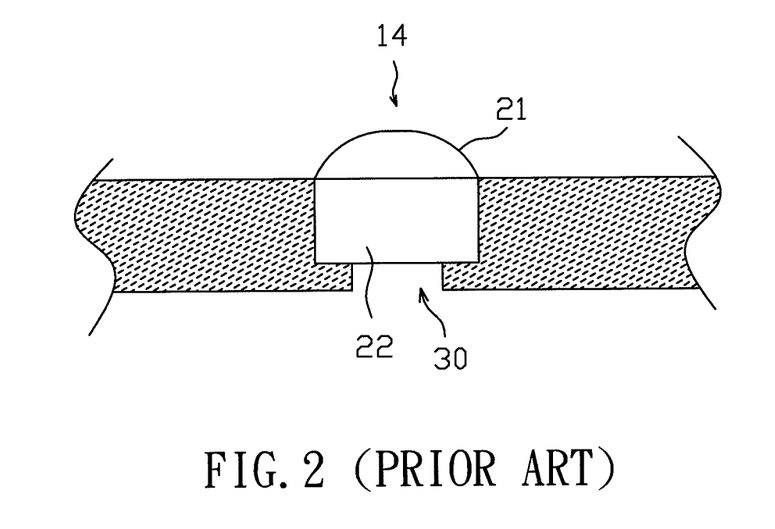
FIG. 2 shows a cross-sectional view taken along section line A-A' in FIG. 1.

FIG. 1 shows a top view of a conventional robot arm for delivering a wafer. FIG. 2 shows a cross-sectional view taken along section line A-A' in FIG. 1. As shown in FIG. 1, the robot arm 10 includes a driving device 11 and a carrier plate 12. The driving device 11 is connected to the carrier plate 12. When a wafer 13 is on the carrier plate 12, the driving device 11 moves the carrier plate 12 to transfer the wafer 13. In general, a plurality of contact pads 14 is disposed on an inner ring 15. In a conventional art, the contact pads 14 are pasted with adhesive glue on one surface of the inner ring 15 so as to prevent the wafer being in contact with the surface of the carrier plate 12. Since the contact pads 14 are frequently in contact with the bottom surface of the wafer 13, there is wear and tear on the contact pads 14. As a result, the contact pads 14 must be replaced on a regular time schedule, which increases the manufacturing cost. In addition, the wafer-operating machine must be adjusted after the replacement of the contact pads 14, so that the wafer 13 can be horizontally location on the contact pads 14 of the inner ring 15.

As above stated, there is a need for a preferred robot arm in the manufacture of semiconductor devices such that the amount of the dusts produced is less, the wear and tear on the contact pads 14 is improved, and the time needed for adjusting the machine is reduced.

BRIEF SUMMARY OF THE INVENTION

One object of the invention is to provide a robot arm for delivering a wafer, a wafer-operating machine and a member thereof which produce a less amount of dusts and decrease wear and tear on contact pads of these devices.

According to one embodiment of the invention, a robot arm for delivering a wafer is disclosed which comprises a carrier plate, an inner ring, a driving device and at least a contact pad. The inner ring is disposed on the carrier plate and defines at least a through-hole. The driving device is connected to the carrier plate to move the carrier plate. The contact pad is disposed at the through-hole of the inner ring and comprises a first protrusion portion and a second protrusion portion. The first protrusion portion protrudes from a first surface of the inner ring and is used for being in contact with the wafer to prevent it from being in contact with the first surface. The second protrusion portion is lodged in the through-hole to fix the contact pad at the inner ring.

In one embodiment, the first protrusion portion of the contact pad has a top surface being a curved surface and protrudes toward a first direction. The second protrusion portion of the contact pad has a bottom surface being a curved surface and protrudes toward a second direction opposite the first direction.

In one embodiment, the top surface of the first protrusion portion includes a plane surface disposed on the upper end of the top surface of the first protrusion portion and is adapted for being in contact with the back surface of the wafer, and the area of the plane surface is about 1.75~2.25 mm$^2$.

In one embodiment, the inner ring comprises a convex rib disposed on a well of the inner ring defining the through-hole so that the through-hole are formed as comprising a first hole, a second hole and a communication hole. The location of the communication hole corresponds to that of the convex rib and the communication hole is in communication with both the first hole and the second hole. The second protrusion portion of the contact pad is protruded from the bottom surface of the convex rib so that the second protrusion portion is lodged at the convex rib. The contact pad further comprises a first embedded portion and a second embedded portion. The first embedded portion is connected to the first protrusion portion and located in the first hole. The second embedded portion is connected between the first embedded portion and the second protrusion portion and located in the communication hole. In one embodiment, the second protrusion portion is located in the second hole and is not protruded from a second surface of the inner ring opposite the first surface.

In one embodiment, the material of the contact pad comprises at least a silicone so that the contact pad has a quality of producing less amount of dust. The hardness of the contact pad is at least about 38 HS so that the contact pad can have a high wear resistance.

In one embodiment, a wafer-operating machine is provided which is used for operating at least a wafer and comprises a robot arm according to the above embodiments.

In one embodiment, a member of a wafer-operating machine comprises a carrier plate, at least a contact pad, a first protrusion portion and a second protrusion portion. The carrier plate defines at least a through hole. The at least a contact pad is disposed in the through-hole and comprises a first protrusion portion and a second protrusion portion. The first protrusion portion protrudes from a first surface of the carrier plate and is used for being in contact with the wafer to prevent the wafer from being in contact with the first surface. The second protrusion portion is lodged in the through-hole to fix the contact pad at the carrier plate.

According to the above designs, in the robot arm for delivering a wafer and wafer-operating machine of an embodiment of the present invention, a second protrusion portion is lodged in the through-hole of the inner ring to fix the contact pad at the inner ring. The contact pad 140 is relatively easily taken apart from the through-hole of the inner ring since the adhesive glue is not used. This makes the inner ring is less likely to be damaged during the replacement of the contact pad. In addition, the hardness of the contact pad is at least about 38 HS in an embodiment of the present invention. Accordingly, the contact pad can have a high wear resistance so that wear and tear on the contact pad is reduced. In addition, the number of replacement of the contact pad is decreased and the time for maintenance of the machine is decreased.

Other objects and advantages of the invention can be better understood from the technical characteristics disclosed by the invention. In order to clarify the above mentioned and other objects and advantages of the invention, examples accompanying with figures are provided and described in details in the following.

DETAILED DESCRIPTION OF THE INVENTION

FIG. 2 shows a cross-sectional view taken along section line A-A' in FIG. 1. As shown in FIG. 2, a contact pad 14 according to prior art includes a protrusion portion 21 and an embedded portion 22. The contact pad 14 is disposed in a hole defined by a conventional inner ring 15. The bottom surface of the inner ring 15 defines an opening 30 which is in communication with hole. The contact pad 14 is pasted with adhesive glue on the well of the hole so that the contact pad 14 is fixed in the hole of the inner ring 15.

An excess amount of the used adhesive glued would results in uneven protrusion heights of the contact pads 14, so that the contact pads 14 are required to be dismounted and then pasted several times to calibrate their horizontal positions. In addition, to replace or dismount a contact pad 14, it is necessary to push the contact pad 14 from the opening 30 side toward the top surface of the inner ring 15 by inserting a stick into the opening 30. Since the contact pad 14 is pasted on the wall of the hole, the contact pad 14 is not easily taken away from the hole. To dismount the contact pad 14, a large force is required to be exerted on the stick. This would frequently alter the original direction of the stick, and cause the inner ring 15 be scraped by the stick. As a result, the inner ring 15 is damaged and needed to be replaced.

Figure 3:
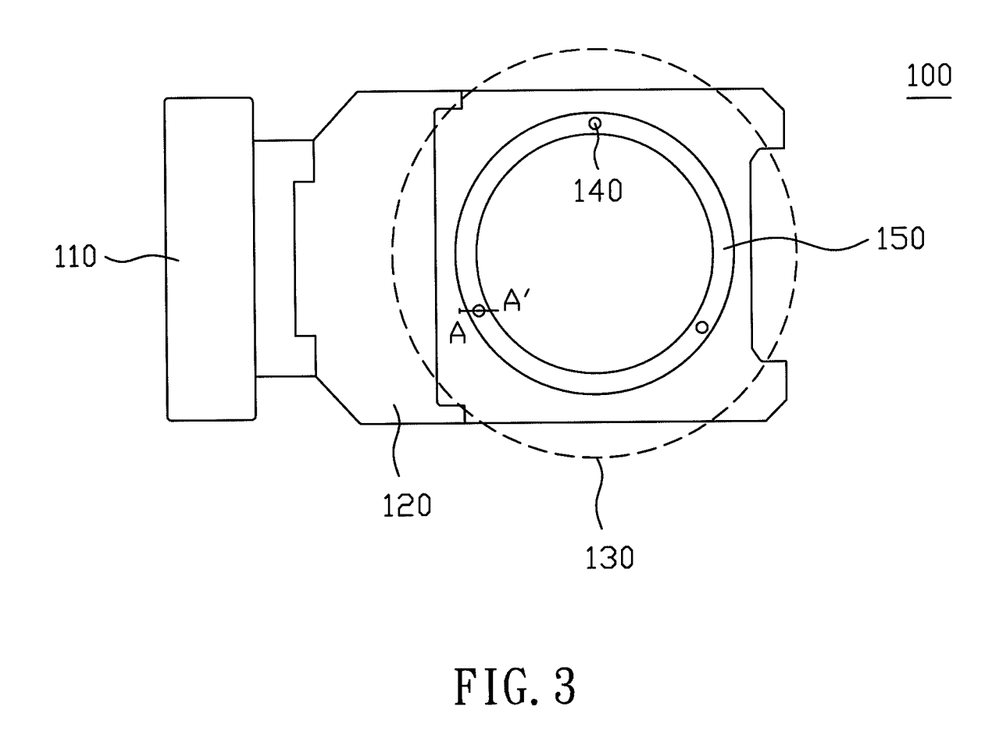
FIG. 3 shows a top view of a robot arm for delivering a wafer according to an embodiment of the present invention.

FIG. 3 shows a top view of a robot arm for delivering a wafer according to an embodiment of the present invention. As shown in FIG. 3, the robot arm 100 for delivering a wafer is adapted for holding the wafer 130 from the back surface of the wafer 130 to transfer it. The robot arm 100 for delivering a wafer includes a carrier plate 120, a driving device 110 and at least a contact pad 140. The driving device 110 is connected to the carrier plate 120 and moves the carrier plate 120 a distance. The contact pad 140 is protruded from a surface of the carrier plate 120 to prevent the wafer 130 being in contact with the surface of the carrier plate 120. In this embodiment, the robot arm 100 for delivering a wafer may further include an inner ring 150 detachablely disposed on the carrier plate 120, and the contact pad 140 is disposed on the inner ring 150.

Figure 4A:
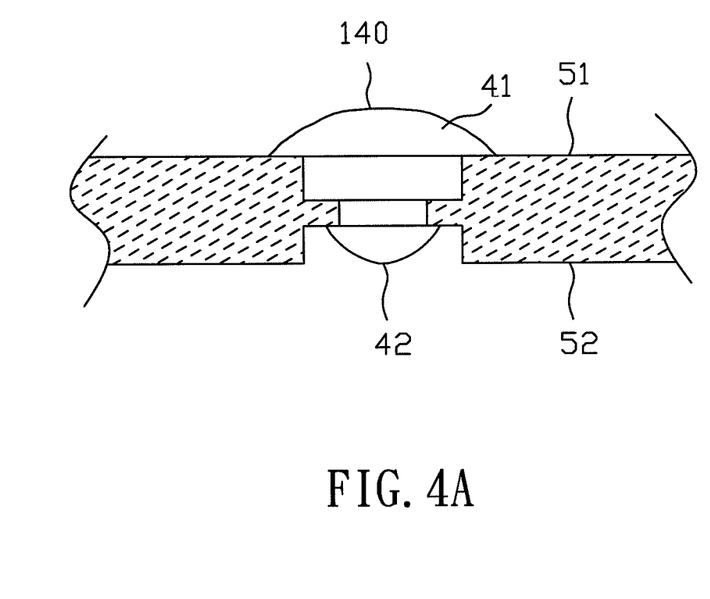
FIG. 4A shows a cross-sectional view taken along section line A-A' in FIG. 3.
Figure 4B:
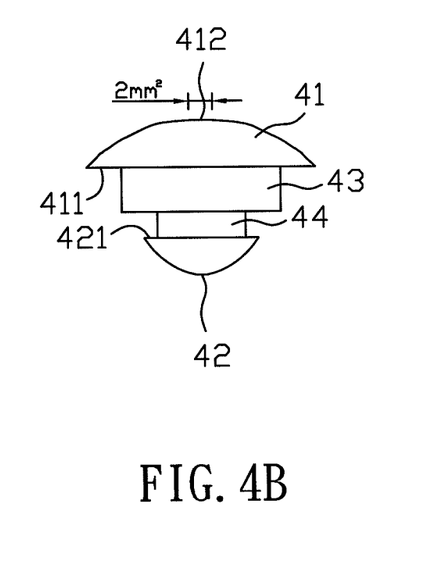
FIG. 4B shows a cross-sectional of a contact pad in FIG. 4A.
Figure 4C:
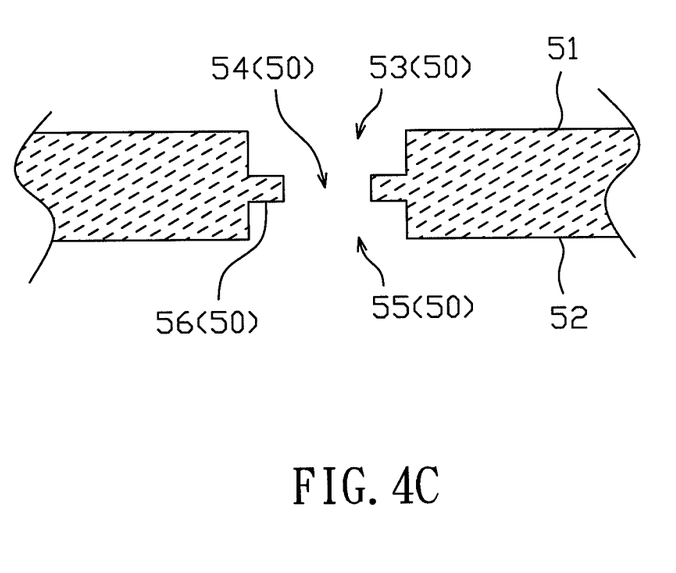
FIG. 4C shows an inner ring without a contact pad in FIG. 4A.

FIG. 4A shows a cross-sectional view taken along section line A-A' in FIG. 3. FIG. 4B shows a cross-sectional of a contact pad in FIG. 4A. FIG. 4C shows an inner ring without a contact pad in FIG. 4A. In this embodiment, the material of the contact pad 140 comprises at least a silicone. An advantage of using the silicone is that the silicone has a quality of producing less amount of dust, and it also can be mixed with an additive at different concentration so as to let the contact pad 140 have a desired hardness. Preferably, the hardness of the contact pad 140 is at least about 38 HS (Shore scleroscope hardness) so that the contact pad 140 can have a high wear resistance. In addition, another advantage of using the silicone is that the silicone have a shock-absorbing function to reduce oscillation of the wafer 130.

As shown in FIG. 4B, the contact pad 140 includes a top protrusion portion 41, a top embedded portion 43, a bottom embedded portion 44 and a bottom protrusion portion 42. The top surface of the top protrusion portion 41 is a curved surface protruding toward the upward direction such that the contact area between the contact pad 140 and the back surface of the wafer 130 can be reduced. The upper end of the top surface of the contact pad 140 includes a plane surface 412 for being in contact with the back surface of the wafer 130. The area of the plane surface 412 is about 1.75~2.25 mm$^2$, preferably about 2 mm$^2$. If the area of the plane surface 412 is about 1.75~2.25 mm$^2$, the contact area between the contact pad 140 and the back surface of the wafer 130 can provide sufficient friction force such that the wafer 130 is not moved off the contact pad 140 as a result of centrifugal force during rotation of the wafer 130. The bottom surface of the top protrusion portion 41 is a plane surface and is connected with the top surface of the top embedded portion 43. The area of the bottom surface of the top protrusion portion 41 is larger than that of the top surface of the top embedded portion 43 so that the side edge of the bottom protrusion portion 41 is protruded from the side of the top surface of the top embedded portion 43 and formed as a side edge portion 411. The bottom surface of the bottom protrusion portion 42 is a curved surface protruding toward the downward direction. The top surface of the bottom protrusion portion 42 is a plane surface and is connected with the bottom surface of the bottom embedded portion 44. The area of the top surface of the top protrusion portion 42 is larger than that of the bottom surface of the bottom embedded portion 44 so that the side edge of the top protrusion portion 42 is protruded from the side of the bottom surface of the bottom embedded portion 44 and formed as a side edge portion 421. The bottom surface of the top embedded portion 43 is connected with the top surface of the bottom embedded portion 44. In one embodiment, the area of the bottom surface of the top embedded portion 43 is larger than that of the top surface of the bottom embedded portion 44.

As shown in FIG. 4C, the inner ring 150 includes a top surface 51 and a bottom surface 52, and it also defines a through-hole 50. A convex rib 56 is protruded toward the center of the through-hole 50 from the inner well of the through-hole 50, so that a top hole 53, a bottom hole 55 and a communication hole 54 are formed. The location of the communication hole 54 corresponds to that of the convex rib 56 and the communication hole 54 is in communication with both the top hole 53 and the bottom hole 55.

As shown in FIG. 4A, when the contact pad 140 is disposed in the through-hole 50, the top protrusion portion 41 is protruded from the top surface 51 and the side edge portion 411 of the bottom surface of the top protrusion portion 41 lies flat on the top surface 51. The top embedded portion 43 is embedded in the top hole 53. The bottom embedded portion 44 is embedded in the communication hole 54. The bottom protrusion portion 42 is protruded from the bottom surface of the convex rib 56 and located in the bottom hole 55. The side edge portion 421 of the top surface of the bottom protrusion portion 42 lies flat on the bottom surface of the convex rib 56. Since the side edge portion 421 lies flat on the bottom surface of the convex rib 56, the contact pad 140 would be stuck on the bottom surface of the convex rib 56 and cannot be taken apart from the through-hole 50. Specifically, the top protrusion portion 41 of the contact pad 140 provides a force in a first direction to support the wafer 130, while the bottom protrusion portion 42 provides a force in second direction to prevent the contact pad 140 from being taken apart from the through-hole 50. The first direction and the second direction are opposite or they define a predetermined angle therebetween. By this way the adhesive glue may not be used, and the protrusion heights of the contact pads 140 disposed on the inner ring 150 may be more uniform than that of the convention contact pads 14. When the contact pad 140 is replaced, it will be relatively easily taken apart from the through-hole 50 of the inner ring 150 since the adhesive glue is not used. This makes the inner ring 150 is less likely to be damaged, and reduces the number of the replacements of the inner ring 150. In a preferred embodiment, the bottom portion of the bottom protrusion portion 42 is not protruded from the bottom surface 52. An advantage of the preferred embodiment is described as follow. When a robot arm 100 insert its carrier plate 120 into a wafer cassette (not shown) to hold a wafer 130, the bottom protrusion portion 42 does not rub against another wafer 130 below the wafer 130 to be held since the bottom protrusion portion 42 is in embedded in the bottom hole 55 and is not protruded from the bottom surface 52. Accordingly, the damage of the another wafer 130 is prevented.

Figure 5:
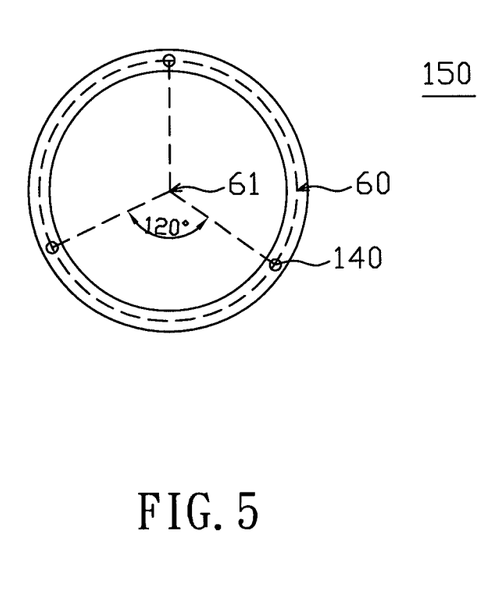
FIG. 5 shows a top view of a inner ring according to an embodiment of the present invention.

FIG. 5 shows a top view of a inner ring according to an embodiment of the present invention. As shown in FIG. 5, the number of the contact pad 140 is three in this embodiment. Since three points can form a plane, the total contact area between the contact pads 140 and the wafer 130 can be reduced while the wafer 130 can also be hold stably without leaning. In a preferred embodiment, the three contact pads 140 define a virtual circle 60. The three contact pads 140 and the center 61 of the virtual circle 60 form three lines. The angle between two adjacent lines among the three lines is 120 degree. Accordingly, a robot arm 100 can hold the wafer 130 uniformly so that the stability of holding the wafer 130 is increased and then leaning of the wafer 130 is also prevented.

According to the present invention, a robot arm 100 for delivering a wafer may be applied to a wafer-operating machine in an embodiment, particularly to a wafer-operating machine which rotates the wafer in another embodiment. Preferably, the robot arm 100 is used in a wafer sorter for sorting at least a wafer. In an embodiment, the contact pad 140 may be applied to a member of a wafer-operating machine.

Although the present invention has been fully described by the above embodiments, the embodiments should not constitute the limitation of the scope of the invention. Various modifications or changes can be made by those who are skilled in the art without deviating from the spirit of the invention. Any embodiment or claim of the present invention does not need to reach all the disclosed objects, advantages, and uniqueness of the invention. Besides, the abstract and the title are only used for assisting the search of the patent documentation and should not be construed as any limitation on the implementation range of the invention.

What is claimed is:

1. A robot arm for delivering a wafer comprising:
a carrier plate;
an inner ring disposed on the carrier plate and defining at least a through-hole;
a driving device connected to the carrier plate to move the carrier plate; and
at least a contact pad disposed in the through-hole of the inner ring and comprising:
a first protrusion portion protruding from a first surface of the inner ring toward a first direction, having a top surface being a curved surface and used for being in contact with the wafer to prevent the wafer from being in contact with the first surface; and
a second protrusion portion lodged in the through-hole to fix the contact pad at the inner ring, having a bottom surface being a curved surface and protruding toward a second direction opposite the first direction, wherein a hardness of the contact pad is at least about 38 HS, and a material of the contact pad comprises at least silicone,
wherein the inner ring comprises a convex rib disposed on a well of the inner ring defining the through-hole so that the through-hole are formed as comprising a first hole, a second hole and a communication hole, wherein
a location of the communication hole corresponds to a location of the convex rib and the communication hole is in communication with both the first hole and the second hole; and
the second protrusion portion of the contact pad is protruded from a bottom surface of the convex rib so that the second protrusion portion is lodged at the convex rib,
the contact pad further comprises:
a first embedded portion connected to the first protrusion portion and located in the first hole; and
a second embedded portion connected between the first embedded portion and the second protrusion portion, and located in the communication hole.

2. The robot arm for delivering a wafer according to claim 1, wherein
the top surface of the first protrusion portion includes a plane surface disposed on an upper end of the top surface of the first protrusion portion and is adapted for being in contact with a back surface of the wafer, and
the area of the plane surface is about 1.75-2.25 mm$^2$.

3. The robot arm for delivering a wafer according to claim 1, wherein the second protrusion portion is located in the second hole and is not protruded from a second surface of the inner ring opposite the first surface.

4. The robot arm for delivering a wafer according to claim 3, wherein
a bottom surface of the first protrusion portion is a plane surface and is connected with a top surface of the first embedded portion,
an area of the bottom surface of the first protrusion portion is larger than an area of the top surface of the first embedded portion so that a first side edge portion is formed which is protruded from a side of the top surface of the first embedded portion,
a top surface of the second protrusion portion is a plane surface and is connected with a bottom surface of the second embedded portion,
an area of the top surface of the second protrusion portion is larger than an area of the bottom surface of the second embedded portion so that a second side edge portion is formed which is protruded from a side of the bottom surface of the second embedded portion, and
a bottom surface of the first embedded portion is connected with a top surface of the second embedded portion.

5. The robot arm for delivering a wafer according to claim 4, wherein the area of the bottom surface of the first protrusion portion is larger than that of the top surface of the second embedded portion.

6. The robot arm for delivering a wafer according to claim 1, wherein the number of the contact pads is three.

7. The robot arm for delivering a wafer according to claim 6, wherein
the contact pads define a virtual circle, the contact pads and the center of the virtual circle form three lines, and the angle between two adjacent lines among the three lines is 120 degrees.

8. A wafer-operating machine used for operating at least a wafer, the machine comprising a robot arm for holding the wafer from the back surface of the wafer to deliver the wafer, the robot arm comprising:

a carrier plate;

an inner ring disposed on the carrier plate and defining at least a through-hole;

a driving device connected to the carrier plate to move the carrier plate; and at least a contact pad disposed in the through-hole of the inner ring and comprising:

a first protrusion portion protruding from a first surface of the inner ring toward a first direction, having a top surface being a curved surface and used for being in contact with the wafer to prevent the wafer from being in contact with the first surface; and a second protrusion portion lodged in the through-hole to fix the contact pad at the inner ring, having a bottom surface being a curved surface and protruding toward a second direction opposite the first direction, wherein the inner ring comprises a convex rib disposed on a well of the inner ring defining the through-hole so that the through-hole are formed as comprising a first hole, a second hole and a communication hole, wherein a location of the communication hole corresponds to a location of the convex rib and the communication hole is in communication with both the first hole and the second hole; and the second protrusion portion of the contact pad is protruded from a bottom surface of the convex rib so that the second protrusion portion is lodged at the convex rib, the contact pad further comprises:

a first embedded portion connected to the first protrusion portion and located in the first hole; and a second embedded portion connected between the first embedded portion and the second protrusion portion, and located in the communication hole.

9. The wafer-operating machine according to claim 8, wherein a hardness of the contact pad is at least about 38 HS.

10. The wafer-operating machine according to claim 9, wherein a material of the contact pad comprises at least silicone.

11. The wafer-operating machine according to claim 8, wherein the top surface of the first protrusion portion includes a plane surface disposed on an upper end of the top surface of the first protrusion portion and is adapted for being in contact with a back surface of the wafer, and the area of the plane surface is about 1.75-2.25 mm$^2$.

12. The wafer-operating machine according to claim 8, wherein the second protrusion portion is located in the second hole and is not protruded from a second surface of the inner ring opposite the first surface.

13. The wafer-operating machine according to claim 12, wherein a bottom surface of the first protrusion portion is a plane surface and is connected with a top surface of the first embedded portion, an area of the bottom surface of the first protrusion portion is larger than an area of the top surface of the first embedded portion so that a first side edge portion is formed which is protruded from a side of the top surface of the first embedded portion, a top surface of the second protrusion portion is a plane surface and is connected with a bottom surface of the second embedded portion, an area of the top surface of the second protrusion portion is larger than an area of the bottom surface of the second embedded portion so that a second side edge portion is formed which is protruded from a side of the bottom surface of the second embedded portion, and a bottom surface of the first embedded portion is connected with a top surface of the second embedded portion.

14. The wafer-operating machine according to claim 13, wherein the area of the bottom surface of the first protrusion portion is larger than an area of the top surface of the second embedded portion.

15. The wafer-operating machine according to claim 8, wherein the number of the contact pads is three.

16. The wafer-operating machine according to claim 15, wherein the contact pads define a virtual circle, the contact pads and the center of the virtual circle form three lines, and the angle between two adjacent lines among the three lines is 120 degrees.

17. The wafer-operating machine according to claim 8, wherein the wafer-operating machine is a wafer sorter for sorting the at least a wafer.

* * * * *